US009236464B2

(12) United States Patent
Chiang et al.

(10) Patent No.: US 9,236,464 B2
(45) Date of Patent: Jan. 12, 2016

(54) METHOD OF FORMING A HIGH ELECTRON MOBILITY TRANSISTOR

(71) Applicant: Taiwan Semiconductor Manufacturing Company, Ltd., Hsin-Chu (TW)

(72) Inventors: Chen-Hao Chiang, Jhongli (TW); Chi-Ming Chen, Zhubei (TW); Chung-Yi Yu, Hsin-Chu (TW); Po-Chun Liu, Hsin-Chu (TW); Han-Chin Chiu, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 18 days.

(21) Appl. No.: 14/549,352

(22) Filed: Nov. 20, 2014

(65) Prior Publication Data

US 2015/0087118 A1 Mar. 26, 2015

Related U.S. Application Data

(62) Division of application No. 13/571,169, filed on Aug. 9, 2012, now Pat. No. 8,912,570.

(51) Int. Cl.

*H01L 29/78* (2006.01)
*H01L 29/778* (2006.01)

(Continued)

(52) U.S. Cl.

CPC ........ *H01L 29/7784* (2013.01); *H01L 29/0891* (2013.01); *H01L 29/2003* (2013.01); *H01L 29/66462* (2013.01); *H01L 29/7787* (2013.01)

(58) Field of Classification Search

CPC . H01L 29/402; H01L 21/0254; H01L 29/778; H01L 29/452

USPC ........................................................ 438/172

See application file for complete search history.

(56) References Cited

U.S. PATENT DOCUMENTS 7,170,111 B2 1/2007 Saxler
8,114,717 B2 2/2012 Palacios et al.

(Continued)

FOREIGN PATENT DOCUMENTS

TW 200527674 8/2005
TW 200809981 2/2008

(Continued)

OTHER PUBLICATIONS

Cai, Y., et al., "High-Performance Enhancement-Mode A1GaN/GaN HEMTs Using Fluoride-Based Plasma Treatment," IEEE Electron Device Letters, vol. 26, No. 7, Jul. 2005, pp. 435-437.

(Continued)

*Primary Examiner* — Tran Tran

(74) *Attorney, Agent, or Firm* — Slater & Matsil, L.L.P.

(57) ABSTRACT

A method of forming a high electron mobility transistor may include: forming a second III-V compound layer on a first III-V compound layer, the second III-V compound layer and the first III-V compound layer differing in composition; forming a p-type doped region in the first III-V compound layer; forming an n-type doped region in the second III-V compound layer, the n-type doped region overlying the p-type doped region; forming a source feature over the second III-V compound layer, the source feature overlying the n-type doped region; and forming a gate electrode over the second III-V compound layer, the gate electrode disposed laterally adjacent to the source feature.

20 Claims, 8 Drawing Sheets

100B
118
116
122
116
110
120
114
106
114
112
104
112
102
108
124

(51) Int. Cl.

| | |
|---|---|
| ***H01L 29/66*** | (2006.01) |
| ***H01L 29/08*** | (2006.01) |
| ***H01L 29/20*** | (2006.01) |

(56) References Cited

U.S. PATENT DOCUMENTS

| | | | | |
|---|---|---|---|---|
| 2007/0224710 | A1 | 9/2007 | Palacios et al. | |
| 2007/0269968 | A1 | 11/2007 | Saxler et al. | |
| 2008/0258150 | A1 | 10/2008 | McCarthy et al. | |
| 2011/0018002 | A1 | 1/2011 | Chen et al. | |
| 2012/0019284 | A1 * | 1/2012 | Mauder | H01L 29/402 326/49 |
| 2012/0091522 | A1 | 4/2012 | Ozaki et al. | |

FOREIGN PATENT DOCUMENTS

| | | |
|---|---|---|
| TW | 200903858 | 1/2009 |
| TW | 201220502 | 5/2012 |
| TW | 201225297 | 6/2012 |

OTHER PUBLICATIONS

Chen, H., et al., "Enhancement-mode A1GaN/GaN HEMTs Frabricated by Standard Fluorine Ion Implantation," Dept. of Electronic and Computer Engineering, Hong Kong University of Science and Technology, Hong Kong, CS Mantech Conference, May 17-20, 2010, pp. 145-148.

Fellows, J., et al., "Electrical activation studies of GaN implanted with Si from low to high dose," Applied Physics Letter, vol. 80, No. 11, Mar. 18, 2002, pp. 1930-1932.

Imada, T., et al., "Enhancement-Mode GaN MIS-HEMTs for Power Supplies," The 2010 International Power Electronics Conference, 7 pages.

Tsai, M., et al., "Improving Light Output Power of the GaN-Based Vertical-Injection Light-Emitting Diodes by Mg+ Implanted Current Blocking Layer," IEEE Photonics Technology Letters, vol. 21, No. 11, Jun. 1, 2009, pp. 688-690.

* cited by examiner

METHOD OF FORMING A HIGH ELECTRON MOBILITY TRANSISTOR

PRIORITY CLAIM AND CROSS-REFERENCE

This application is a divisional of U.S. patent application Ser. No. 13/571,169, entitled "High Electron Mobility Transistor and Method of Forming the Same," filed on Aug. 9, 2012, which application is related to commonly owned and co-pending U.S. patent application Ser. No. 13/571,136, now issued as U.S. Pat. No. 8,624,296 B1, entitled "High Electron Mobility Transistor Including an Embedded Fluorine Region," filed on Aug. 9, 2012, which applications are incorporated herein by reference.

TECHNICAL FIELD

This disclosure relates generally to a semiconductor structure and, more particularly, to a high electron mobility transistor (HEMT) and method for forming a high electron mobility transistor.

BACKGROUND

In semiconductor technology, due to their characteristics, Group III-Group V (or III-V) semiconductor compounds are used to form various integrated circuit devices, such as high power field-effect transistors, high frequency transistors, or high electron mobility transistors (HEMTs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility and the ability to transmit signals at high frequencies, etc.

From an application point of view, HEMTs have many advantages. Despite the attractive properties noted above, a number of challenges exist in connection with developing III-V semiconductor compound-based devices. Various techniques directed at configurations and materials of these III-V semiconductor compounds have been implemented to try and further improve transistor device performance.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

A plurality of semiconductor chip regions is divided on the substrate by scribe lines between the chip regions. The substrate will go through a variety of cleaning, layering, patterning, etching and doping steps to form integrated circuits. The term "substrate" herein generally refers to the bulk substrate on which various layers and device structures are formed. In some embodiments, the substrate includes silicon or a compound semiconductor, such as GaAs, InP, Si/Ge, or SiC. Examples of such layers include dielectric layers, doped layers, polysilicon layers or conductive layers. Examples of device structures include transistors, resistors, and/or capacitors, which may be interconnected through an interconnect layer to additional integrated circuits.

Figure 1A:
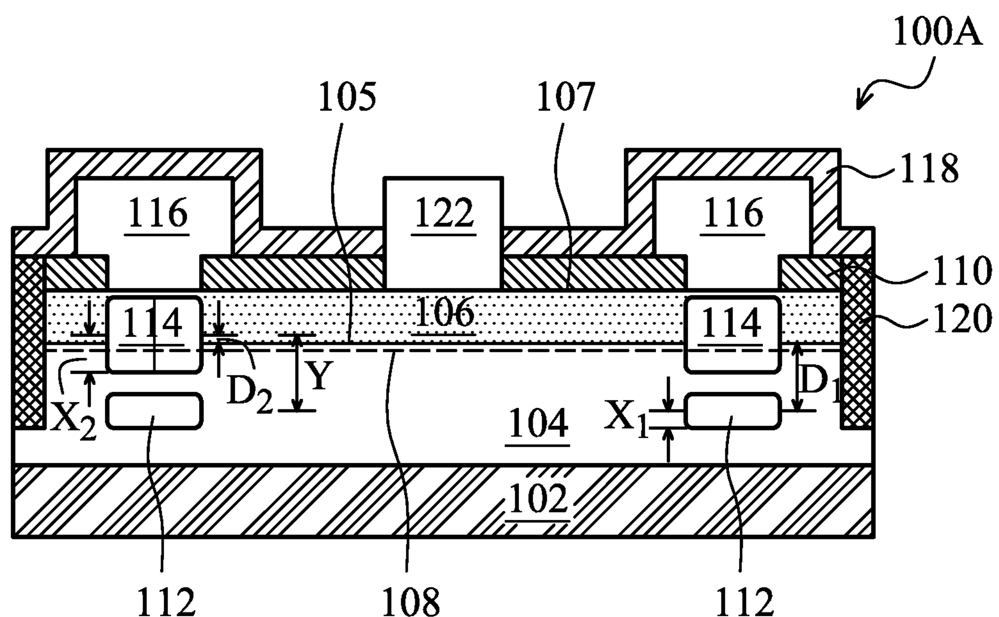
FIG. 1A is a cross-sectional view of a semiconductor structure having a high electron mobility transistor (HEMT) according to one embodiment of this disclosure.

FIG. 1A is a cross-sectional view of a semiconductor structure 100A having a high electron mobility transistor (HEMT) according to one or more embodiments of this disclosure. The semiconductor structure 100A includes a substrate 102. In the present example, the substrate 102 includes a silicon substrate. In some embodiments, the substrate 102 includes a silicon carbide (SiC) substrate or sapphire substrate.

The semiconductor structure 100A also includes a heterojunction formed between two different semiconductor material layers, such as material layers with different band gaps. In at least one embodiment, the semiconductor structure 100A includes a first III-V compound layer (or referred to as a channel layer) 104 formed on the substrate 102 and a second III-V compound layer (or referred to as a donor-supply layer) 106 formed on the channel layer 104. The channel layer 104 and the donor-supply layer 106 are compounds made from the III-V groups in the periodic table of elements. However, the channel layer 104 and the donor-supply layer 106 are different from each other in composition. The channel layer 104 is undoped or unintentionally doped (UID). In the present example of the semiconductor structure 100A, the channel layer 104 includes a gallium nitride (GaN) layer (also referred to as the GaN layer 104). In the present example, the donor-supply layer 106 includes an aluminum gallium nitride (AlGaN) layer (also referred to as AlGaN layer 106). The GaN layer 104 and AlGaN layer 106 directly contact each other. In some embodiments, the channel layer 104 includes a GaAs layer or InP layer. In some embodiments, the donor-supply layer 106 includes an AlGaAs layer, AlN or AlInP layer.

A band gap discontinuity exists between the AlGaN layer 106 and the GaN layer 104. The electrons from a piezoelectric effect in the AlGaN layer 106 drop into the GaN layer 104, creating a thin layer 108 of highly mobile conducting electrons in the GaN layer 104. This thin layer 108 is also referred to as a two-dimensional electron gas (2-DEG), and forms a carrier channel (also referred to as the carrier channel 108). The carrier channel 108 is located at the GaN layer 104 near an interface 105 of the AlGaN layer 106 and the GaN layer 104. Thus, the carrier channel 108 has high electron mobility because the GaN layer 104 is undoped or unintentionally doped, and the electrons can move freely without collision or with substantially reduced collisions with impurities.

In some embodiments, the GaN layer 104 is undoped. In some embodiments, the GaN layer 104 is unintentionally doped, such as lightly doped with n-type dopants due to a precursor used to form the GaN layer 104. In at least one example, the GaN layer 104 has a thickness in a range from about 0.5 microns to about 10 microns.

In some embodiments, the AlGaN layer 106 is intentionally doped. In at least one example, the AlGaN layer 106 has a thickness in a range from about 5 nanometers (nm) to about 50 nm.

The semiconductor structure 100A also includes a dielectric cap layer 110 disposed on a top surface 107 of the AlGaN layer 106. The dielectric cap layer 110 further includes a plurality of openings that expose a portion of the AlGaN layer 106 for a gate electrode formation and source/drain features formation. The dielectric cap layer 110 comprises silicon oxide or silicon nitride. The dielectric cap layer 110 protects the underlying AlGaN layer 106 from damage in the following processes having plasma environments.

The semiconductor structure 100A also includes source/drain features 116 disposed on the AlGaN layer 106 and configured to electrically connect to the carrier channel 108. The AlGaN layer 106 has a substantially flat top surface between the source feature 116 and the drain feature 116. In at least one embodiment, the source/drain features 116 are formed in the openings of the dielectric cap layer 110. The source/drain feature 116 is at least partially embedded in the AlGaN layer 106, and overlies a portion of the dielectric cap layer 110. In some embodiments, the source/drain feature 116 is further embedded in a top portion of the GaN layer 104.

Each of the source/drain features 116 comprises Ti, Co, Ni, W, Pt, Ta, Pd, Mo, Al or TiN. In at least one embodiment, the source/drain feature 116 is free of Au. In some embodiments, the source/drain feature 116 comprises multiple metal layers. In certain embodiments, the source/drain feature 116 comprises an intermetallic compound constructed by a metal layer and the AlGaN layer 106 and the GaN layer 104. The source/drain feature 116 contacts the carrier channel 108 located near the interface 105 of the AlGaN layer 106 and the GaN layer 104.

The semiconductor structure 100A also includes a n-type doped region 114 under each source/drain feature 116 in the AlGaN layer 106. The n-type refers to making electrons as majority charge carriers in a semiconductor material. The n-type doped region 114 contacts the carrier channel 108 and improves electrical connection between the source/drain features 116 and the carrier channel 108. The n-type doped region 114 may comprise elements from IV groups in the periodic table (Group IV elements). In certain embodiments, the n-type doped region 114 comprises silicon (Si) or oxygen (O). The n-type doped region 114 has a dosage in a range from about 1E13 to 1E16 atoms/cm$^2$.

Each n-type doped region 114 has a dopant concentration in a Gaussian distribution extending form the top surface 107 into the AlGaN layer 106 and the GaN layer 104. A peak concentration of the dopant concentration for the n-type doped region 114 has a distance $D_2$ away from the interface 105 of the AlGaN layer 106 and the GaN layer 104. In certain embodiments, the distance $D_2$ is less than about 50 nm. The Gaussian distribution of the n-type doped region 114 has an interval $X_2$ from the peak concentration to a boundary of the n-type doped region 114. Within this interval $X_2$, n-type doped region 114 effectively makes electrons as majority charge carriers in a semiconductor material (AlGaN layer 106 and GaN layer 104). In certain embodiments, the interval $X_2$ is less than about 100 nm.

The semiconductor structure 100A also includes a p-type doped region 112 under each n-type doped region 114 in the GaN layer 104. The p-type refers to making holes as majority charge carriers in a semiconductor material. The p-type doped region 112 and the n-type doped region 114 are configured as a PN junction diode. The p-type doped region 112 may block a leakage current in the carrier channel 108 from the n-type doped region 114 down to the substrate 102. The p-type doped region 112 may comprise elements from II groups in the periodic table (Group II elements). In certain embodiments, the p-type doped region 112 comprises magnesium (Mg), calcium (Ca), beryllium (Be) or zinc (Zn). The p-type doped region 112 has a dosage in a range from about 1E13 to 1E16 atoms/cm$^2$.

Each p-type doped region 112 has a dopant concentration in a Gaussian distribution extending from the interface 105 to the GaN layer 104. A peak concentration of the dopant concentration for the p-type doped region 112 has a distance Y under the peak concentration of the n-type doped region 114. In certain embodiments, the distance Y is in a range from about 100 nm to 400 nm. In some embodiments, the peak concentration for the p-type doped region 112 has a distance $D_1$ under the interface 105 of the AlGaN layer 106 and the GaN layer 104. The distance $D_1$ is from about 50 nm to about 350 nm.

The Gaussian distribution of the p-type doped region 112 has an interval $X_1$ from the peak concentration to a boundary of the p-type doped region 112. Within this interval $X_1$, p-type doped region 112 effective makes holes as majority charge carriers in a semiconductor material (GaN layer 104). In certain embodiments, the interval $X_1$ is less than about 100 nm.

The semiconductor structure 100A further includes isolation regions 120 in the GaN layer 104 and the AlGaN layer 106. The isolation regions 120 isolate the HEMT in the structure 100A from other devices in the substrate 102. In at least one example, the isolation region 120 includes a doped region with species of oxygen or nitrogen.

Still referring to FIG. 1A, a protection layer 118 is disposed on top surfaces of the dielectric cap layer 110 and the source/drain features 116. The protection layer 118 further includes an opening that aligns with an opening in the dielectric cap layer 110. The combined opening of the opening in the protection layer 118 and the opening in the dielectric cap layer 110 exposes a portion of the AlGaN layer 106 for gate electrode formation. The protection layer 118 covers the source/drain features 116, and protects the source/drain features 116 from exposure during an annealing process in the formation of the isolation regions 120.

The semiconductor structure 100A also includes a gate electrode 122 disposed in the combined opening over AlGaN layer 106 between the source/drain features 116. The gate electrode 122 includes a conductive material layer configured for applying a gate voltage that in turns controls the carrier channel 108. In various examples, the conductive material layer includes a refractory metal or its compounds, e.g., titanium (Ti), titanium nitride (TiN), titanium tungsten (TiW), titanium tungsten nitride (TiWN), tungsten (W) or tungsten nitride (WN). In at least another example, the conductive material layer includes nickel (Ni), gold (Au) or copper (Cu).

In the semiconductor structure 100A, the carrier channel 108 becomes normally-on. In the operation, a negative gate voltage is applied to turn off the carrier channel 108 of this HEMT. In the semiconductor structure 100A, the HEMT is also called a depletion-mode HEMT (also referred to as depletion-mode HEMT 100A).

Figure 1B:
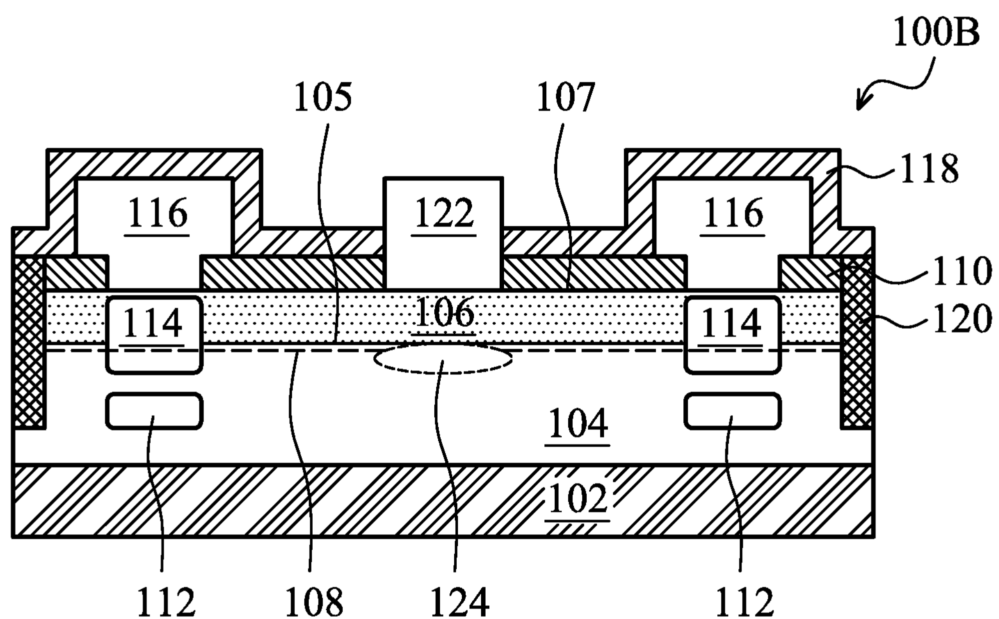
FIG. 1B is a cross-sectional view of a semiconductor structure having an HEMT according to another embodiment of this disclosure.

FIG. 1B is a cross-sectional view of the semiconductor structure 100B having a HEMT according to another embodiment of this disclosure. The layer stacks of the semiconductor structure 100B are similar to the semiconductor structure 100A shown in FIG. 1A. However, the semiconductor structure 100B includes a depletion region 124 in the carrier channel 108 under the combined opening of the protection layer 118 and the dielectric cap layer 110. The depletion region 124 is also under the gate electrode 122. The carrier channel 108 becomes normally-off because of the depletion region 124. In the operation, a positive gate voltage is applied to turn on the carrier channel 108 of this HEMT. In the semiconductor structure 100B, the HEMT is also called an enhanced-mode HEMT (also referred to as enhanced-mode HEMT 100B).

In some embodiments, the enhanced-mode HEMT 100B includes a fluorine-containing region (not shown) in a portion of the AlGaN layer 106 and underlying a portion of the gate electrode 122. It is believed that fluorine ions in the fluorine-containing region provide strong immobile negative charges and effectively deplete the electrons in the depletion region 124 of the carrier channel 108.

In the above described embodiments, the gate electrode 122, the source/drain features 116, and the carrier channel 108 in the GaN layer 104 are configured as a transistor. When a voltage is applied to the gate stack, a device current of the transistor is modulated.

Figure 2A:
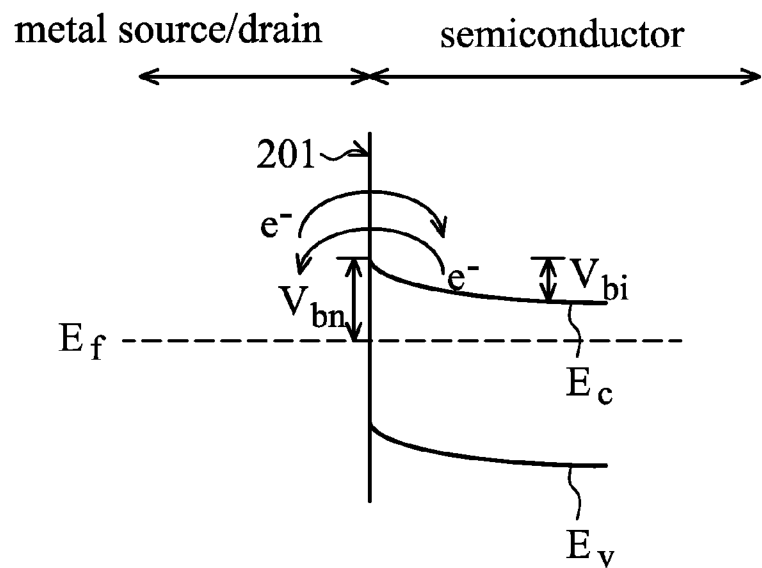
FIG. 2A is a potential diagram of an interface of a source/drain and a III-V compound layer of a comparative HEMT.

FIG. 2A is a potential diagram of an interface 201 of a source/drain and a III-V compound layer of a comparative HEMT. The source/drain includes a metal layer. $E_c$ is the conduction band. $E_f$ is the Fermi level. $E_v$ is the valence band. There is a potential barrier $V_{bn}$ for an electron in metal source/drain trying to move into conductance band $E_c$ of III-V compound layer at the interface 201. Also, there is a built-in potential barrier $V_{bi}$ for an electron in conductance band $E_c$ of III-V compound layer trying to move into metal source/drain at the interface 201. An electron in either side needs to gain enough energy to surmount the potential barrier $V_{bn}$ or $V_{bi}$ to enter the other side. The electrical connection between the metal source/drain and the III-V compound layer of a comparative HEMT is limited.

Figure 2B:
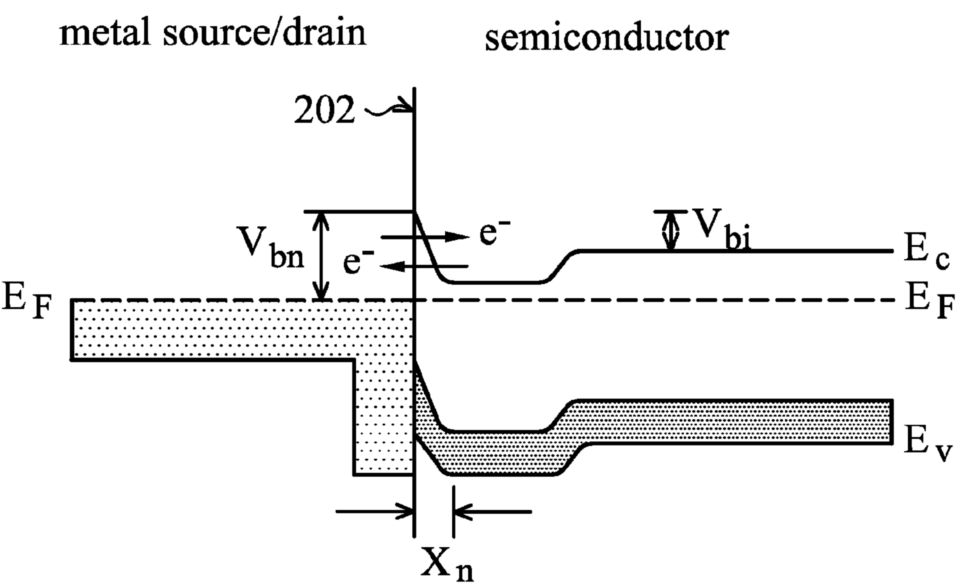
FIG. 2B is a potential diagram of an interface of a source/drain and a III-V compound layer of the HEMT shown in FIGS. 1A and 1B.

FIG. 2B shows a potential diagram of an interface 202 of a metal source/drain feature and a III-V compound layer (AlGaN layer 106 and GaN layer 104) of the HEMT of the semiconductor structure 100A (or 100B) shown in FIG. 1A (or 1B). With the presence of the n-type doped region 114 providing donors, conductance band $E_c$ of the III-V compound layer at the interface 202 is distorted. A width $X_n$ of the conductance band $E_c$ near the interface 202 becomes thinner as the n-type dopants diffusing into the III-V compound layer. A certain amount of electrons in the III-V compound layer and the metal source/drain feature will tunnel through the potential barrier $V_{bn}$ or $V_{bi}$ at the interface 202 and move into the other side. The n-type dopants in the n-type doped region 114 improve electrical connection and form ohmic contacts between the metal source/drain feature 116 and the III-V compound layer in FIGS. 1A and 1B. Also, the implanted p-type doped region 112 and implanted n-type doped region 114 may create nitrogen (N) vacancies in the III-V compound layer. The N vacancies increase carrier concentrations so that the electrical performances between the source/drain feature 116 and the III-V compound layer are improved.

Figure 3:
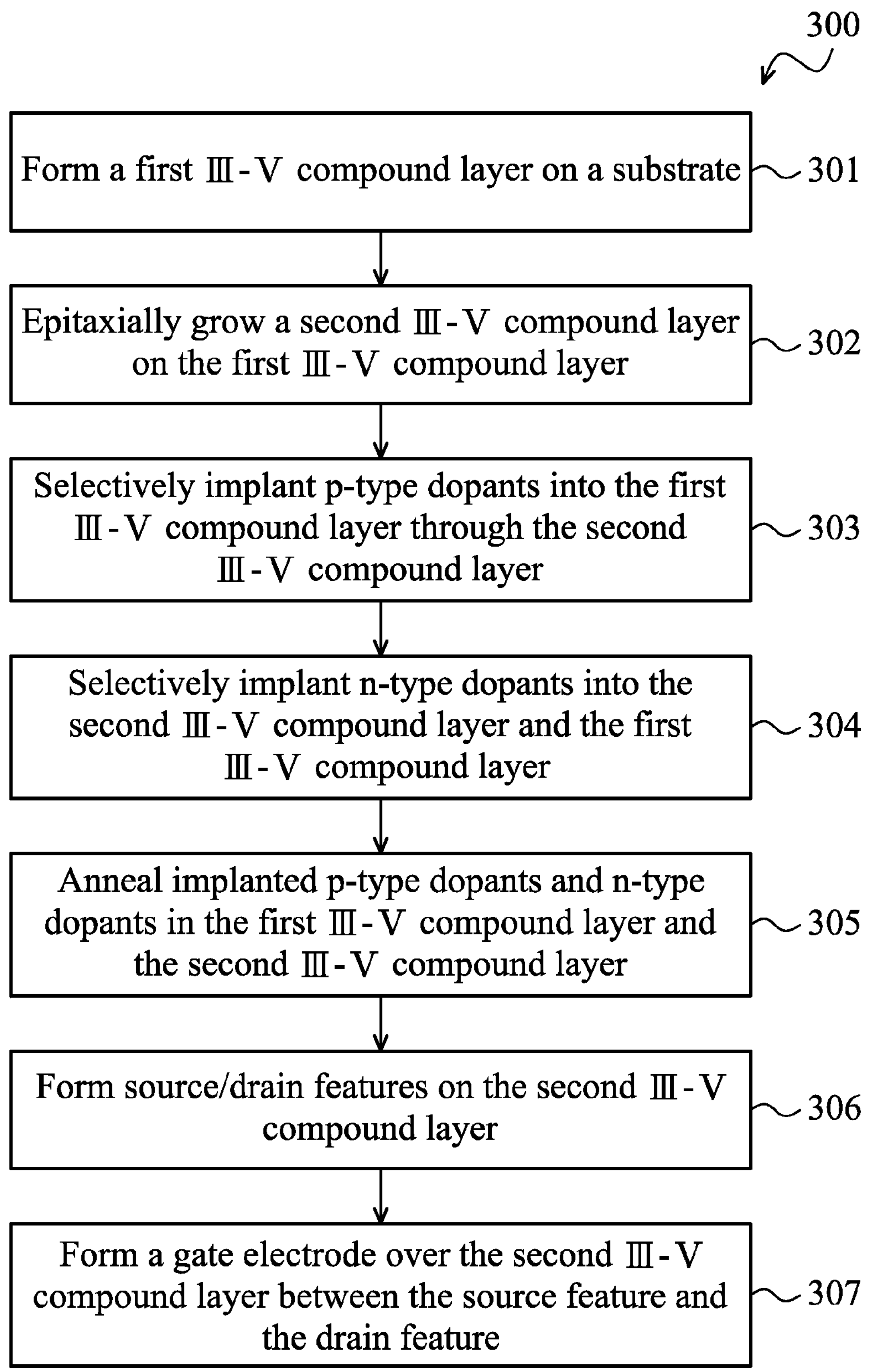
FIG. 3 is a flowchart of a method of forming a semiconductor structure having a HEMT according to one or more embodiments of this disclosure.

FIG. 3 is a flowchart of a method 300 of forming a semiconductor structure having a HEMT according to one or more embodiments of this disclosure. Referring now to FIG. 3, the flowchart of the method 300, at operation 301, a first III-V compound layer is provided. The first III-V compound layer is formed on a substrate. Next, the method 300 continues with operation 302 in which a second III-V compound layer is epitaxially grown on the first III-V compound layer. The method 300 continues with operation 303 in which a plurality of p-type dopants is implanted into the first III-V compound layer. The method 300 continues with operation 304 in which a plurality of n-type dopants is implanted into the second III-V compound layer and the first III-V compound layer. The method 300 continues with operation 305 in which the plurality of p-type dopants and n-type dopants are annealed. The method 300 continues with operation 306 in which source/drain features are formed on the second III-V compound layer. The method 300 continues with operation 307 in which a gate electrode is formed over the second III-V compound layer between the source feature and the drain feature. It should be noted that additional processes may be provided before, during, or after the method 300 of FIG. 3.

FIGS. 4A to 4J are cross-sectional views of the semiconductor structures 100A and 100B each having a HEMT at various stages of manufacture according to various embodiments of the method 300 of FIG. 3. Various figures have been simplified for a better understanding of the inventive concepts of the present disclosure.

Figure 4A:
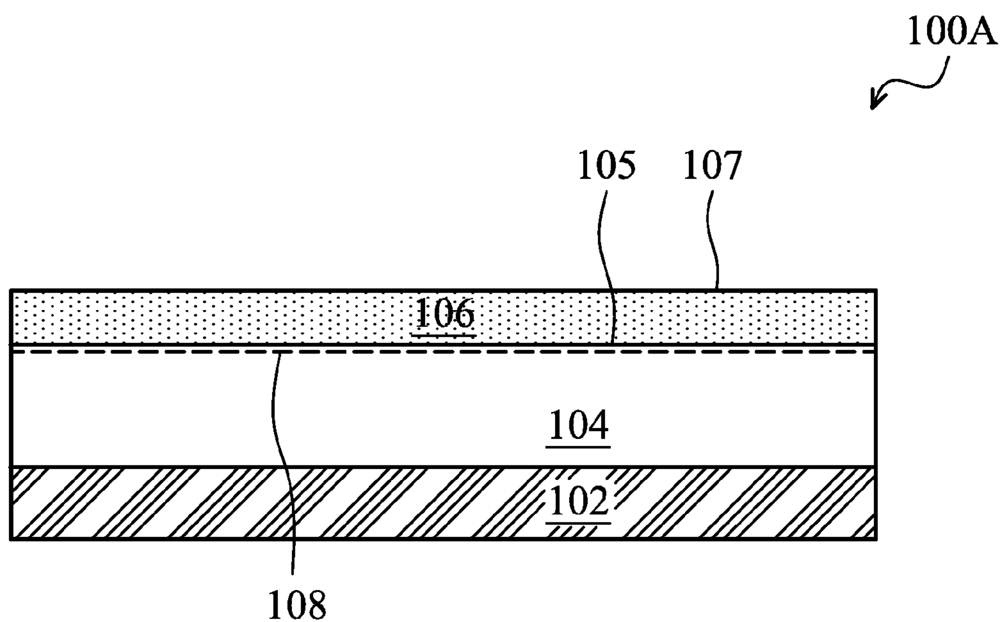
FIGS. 4A to 4J are cross-sectional views of a semiconductor structure having a HEMT at various stages of manufacture according to one or more embodiments of the method of FIG. 3.

Referring to FIG. 4A, which is an enlarged cross-sectional view of a portion of a substrate 102 of a semiconductor structure 100A after performing operations 301 and 302 in method 300. In some embodiments, the substrate 102 includes a silicon carbide (SiC) substrate or sapphire substrate. In the present embodiment, the substrate 102 includes a silicon substrate. A first III-V compound layer 104, also referred to as a channel layer, is formed on the substrate 102. In the embodiment of FIGS. 4A-4J, the first III-V compound layer 104 refers to a gallium nitride (GaN) layer (also referred to as the GaN layer 104). In some embodiments, the GaN layer 104 is epitaxially grown by metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemical. In the embodiment of FIGS. 4A-4J, the GaN layer 104 has a thickness in a range from about 0.5 micron to about 10 microns. In other embodiments, the first III-V compound layer 104 may include a GaAs layer or InP layer.

A second III-V compound layer 106, also referred to as donor-supply layer, is grown on first III-V compound layer 104. An interface 105 is defined between the first III-V compound layer 104 and the second III-V compound layer 106. A carrier channel 108 of 2-DEG is located near the interface 105 in the first III-V compound layer 104. In at least one embodiment, the second III-V compound layer 106 refers to an aluminum gallium nitride (AlGaN) layer (also referred to as the AlGaN layer 106). In the embodiment of FIGS. 4A-4J, the AlGaN layer 106 is epitaxially grown on the GaN layer 104 by MOVPE using aluminum-containing precursor, gallium-containing precursor and nitrogen-containing precursor. The aluminum-containing precursor includes trimethylaluminum (TMA), triethylaluminium (TEA), or other suitable chemicas. The gallium-containing precursor includes TMG, TEG or other suitable chemicals. The nitrogen-containing precursor includes ammonia ($NH_3$), tertiarybutylamine (TBAm), phenyl hydrazine, or other suitable chemicas. In the embodiment of FIGS. 4A-4J, the AlGaN layer 106 has a thickness in a range from about 5 nanometers to about 50 nanometers. In other embodiments, the second III-V compound layer 106 includes an AlGaAs layer, an AlN layer or an AlInP layer.

Figure 4B:
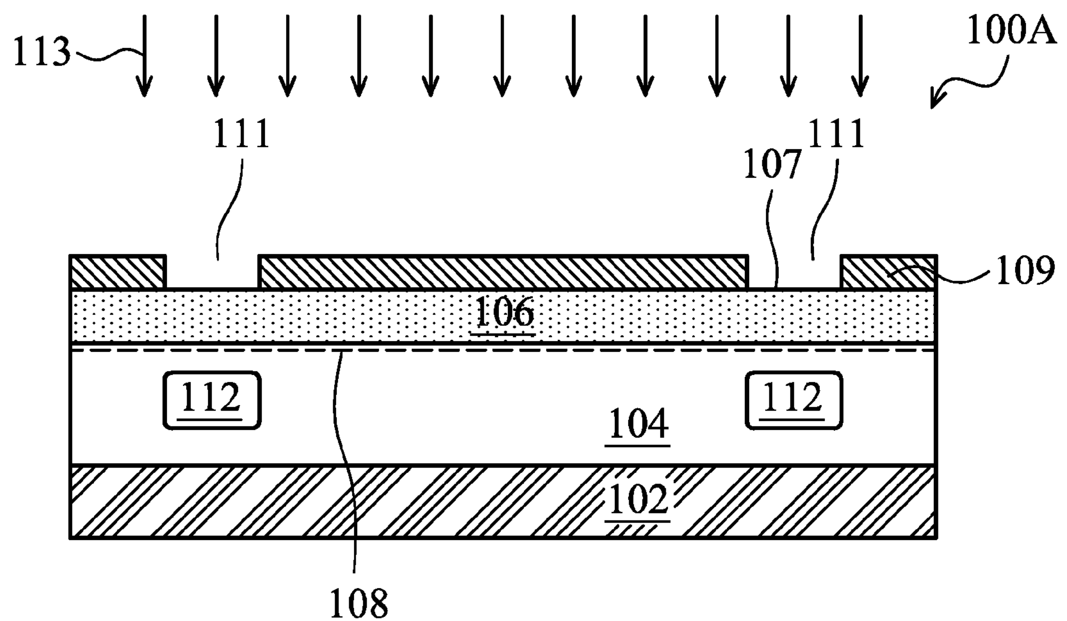

Referring back to FIG. 3, method 300 continues with operation 303. FIG. 4B illustrates a cross-sectional view of the semiconductor structure 100A for manufacture stage after a plurality of p-type dopants is selectively implanted in the first III-V compound layer. In certain embodiments, the implantation of the p-type dopants is performed once. In some embodiments, the implantation of the p-type dopants is performed multiple times.

In FIG. 4B, a photoresist layer 109 is formed over the AlGaN layer 106. The photoresist layer 109 includes openings 111 to expose a portion of a top surface 107 of the AlGaN layer 106. A plurality of p-type dopants 113 is implanted through the openings 111 and the exposed AlGaN layer 106 into the GaN layer 104. The photoresist layer 109 blocks the p-type dopants 113 to the non-exposed underlying layers (AlGaN layer 106 and GaN layer 104), and p-type doped regions 112 are selectively formed in the GaN layer 104 under the openings 111. The p-type dopants 113 may comprise Group II elements. In certain embodiments, the p-type dopants 113 comprise magnesium (Mg), calcium (Ca), beryllium (Be) or zinc (Zn). The p-type doped region 112 has a dosage in a range from about 1E13 to 1E16 atoms/$cm^2$. It is believed that the implantation of the p-type dopants 113 creates nitrogen (N) vacancies in the AlGaN layer 106 and the GaN 104. The N vacancies increase carrier concentrations so that the electrical performances for the HEMT are improved.

Figure 4C:
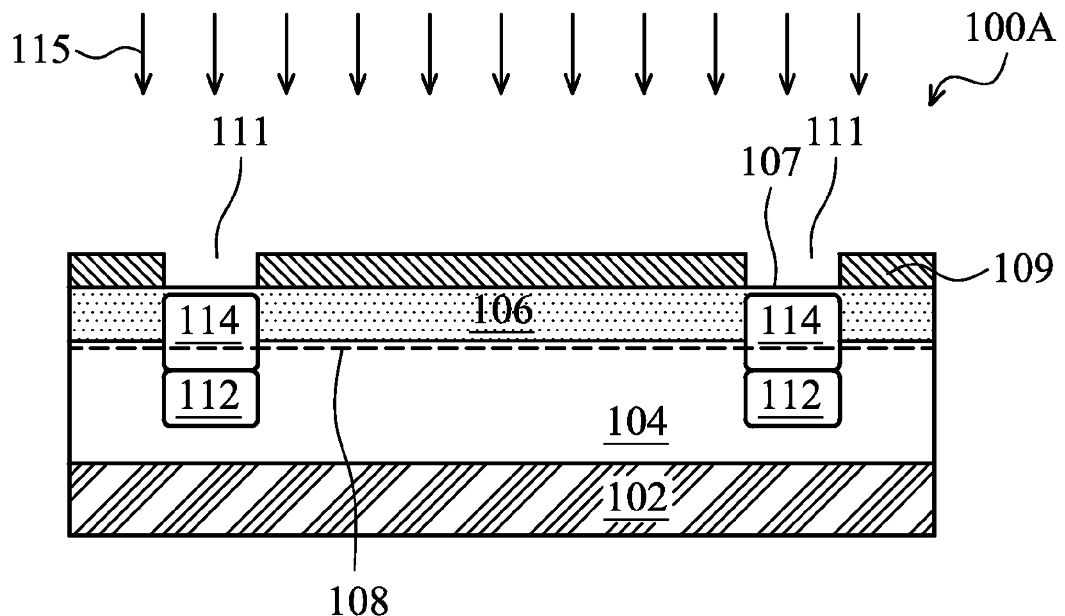

Referring back to FIG. 3, method 300 continues with operation 304. FIG. 4C illustrates a cross-sectional view of the semiconductor structure 100A for manufacture stage after a plurality of n-type dopants is selectively implanted in the second III-V compound layer and the first III-V compound layer. In certain embodiments, the implantation of the n-type dopants is performed once. In some embodiments, the implantation of the n-type dopants is performed multiple times.

In FIG. 4C, a plurality of n-type dopants 115 is implanted through the openings 111 of the photoresist layer 109 into the exposed AlGaN layer 106 and the GaN layer 104. The photo resist layer 109 blocks the n-type dopants 115 to the non-exposed underlying layers (AlGaN layer 106 and GaN layer 104), and n-type doped regions 114 are selectively formed in the AlGaN layer 106 and the GaN layer 104 under the openings 111. The n-type dopants 115 may comprise Group IV elements. In certain embodiments, the n-type dopants 115 comprise silicon (Si) or oxygen (O). The n-type doped region 114 has a dosage in a range from about 1E13 to 1E16 atoms/$cm^2$. With this range of dosage, the n-type dopants 115 could have high activation efficiency in the later annealing process in operation 305. It is believed that the implantation of the n-type dopants 115 also creates nitrogen (N) vacancies in the AlGaN layer 106 and the GaN 104. The N vacancies increase carrier concentrations so that the electrical performances for the HEMT are improved. After the implantation of n-type dopants 115 in operation 304, the photo resist layer 109 is removed.

Figure 4D:
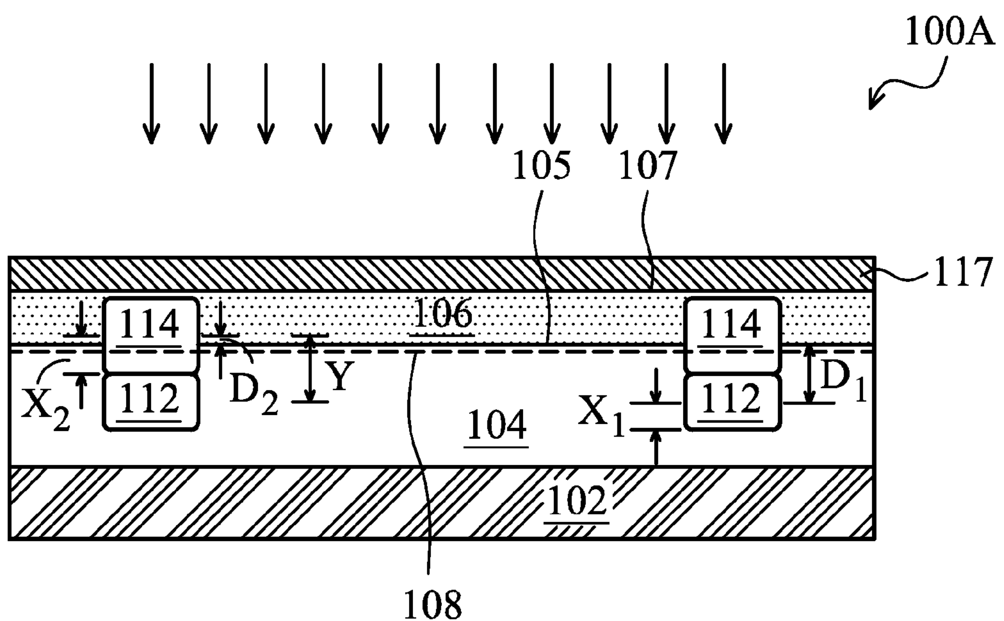

Referring back to FIG. 3, method 300 continues with operation 305. FIG. 4D illustrates a cross-sectional view of the semiconductor structure 100A for manufacture stage after annealing the plurality of p-type dopants and n-type dopants in the second III-V compound layer and the first III-V compound layer.

In FIG. 4D, a cap layer 117 is formed over the AlGaN layer 106. An annealing process is performed on the p-type doped regions 112 and the n-type doped regions 114 in an environment comprising nitrogen. An operation temperature of the annealing process is in a range from about 1100° C. to about 1300° C. to activate the p-type dopants and n-type dopants. The cap layer 117 may prevent the n-type dopants and/or the p-type dopants from diffusing out through the top surface 107 of the AlGaN layer 106. The cap layer 117 includes silicon oxide, silicon nitride or aluminum nitride. Due to the steps of implanting both the p-type dopants and n-type dopants, N vacancies are generated more in the AlGaN layer 106 and the GaN layer 104. The temperature of annealing process could be operated below 1300° C. to achieve optimum carrier concentrations. The device damage due to high temperature annealing above 1300° C. could be prevented. The cap layer 117 is removed after the annealing process in operation 305.

After the annealing process in operation 305, the n-type doped region 114 has a dopant concentration in a Gaussian distribution in the AlGaN layer 106 and the GaN layer 104. A peak concentration of the Gaussian distribution for the n-type doped region 114 has a distance $D_2$ away from the interface 105. In certain embodiments, the distance $D_2$ is less than about 50 nm. The Gaussian distribution of the n-type doped region 114 has an interval $X_2$ from the peak concentration to a boundary of the n-type doped region 114. Within this interval $X_2$, n-type doped region 114 effectively makes electrons as majority charge carriers in a semiconductor material (AlGaN layer 106 and GaN layer 104). In certain embodiments, the interval $X_2$ is less than about 100 nm.

Also, the p-type doped region 112 has a dopant concentration in a Gaussian distribution in the GaN layer 104. A peak concentration of the Gaussian distribution for the p-type doped region 112 has a distance Y under the peak concentration of the n-type doped region 114. In certain embodiments, the distance Y is in a range from about 100 nm to 400 nm. In some embodiments, the peak concentration for the p-type doped region 112 has a distance $D_1$ under the interface 105 of the AlGaN layer 106 and the GaN layer 104. The distance $D_1$ is from about 50 nm to about 350 nm.

Figure 4E:
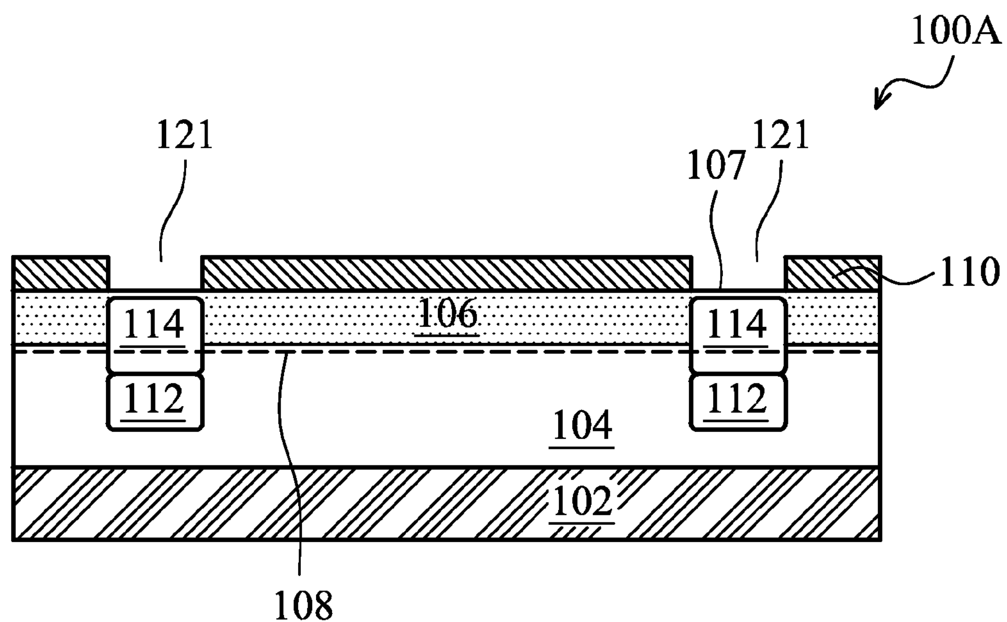

FIG. 4E illustrates a cross-sectional view of the semiconductor structure 100A for manufacture stage after a dielectric layer 110 is deposited on the top surface 107 of the AlGaN layer 106 after performing operation 305. The dielectric layer 110 has a thickness in a range from about 100 angstroms (Å) to about 5000 Å. In some embodiments, the dielectric layer 110 includes silicon oxide or silicon nitride. In at least one example, the dielectric layer 110 is silicon nitride and is formed by performing a low pressure chemical vapor deposition (LPCVD) method, without plasma, using $SiH_4$ and $NH_3$ gases. The dielectric layer 110 protects the underlying AlGaN layer 106 from damage in the following processes including plasma environments. Next, two through holes 121 in the dielectric layer 110 are defined by lithography and etching processes to expose a portion of the AlGaN layer 106 comprising the n-type doped region 114.

Figure 4F:
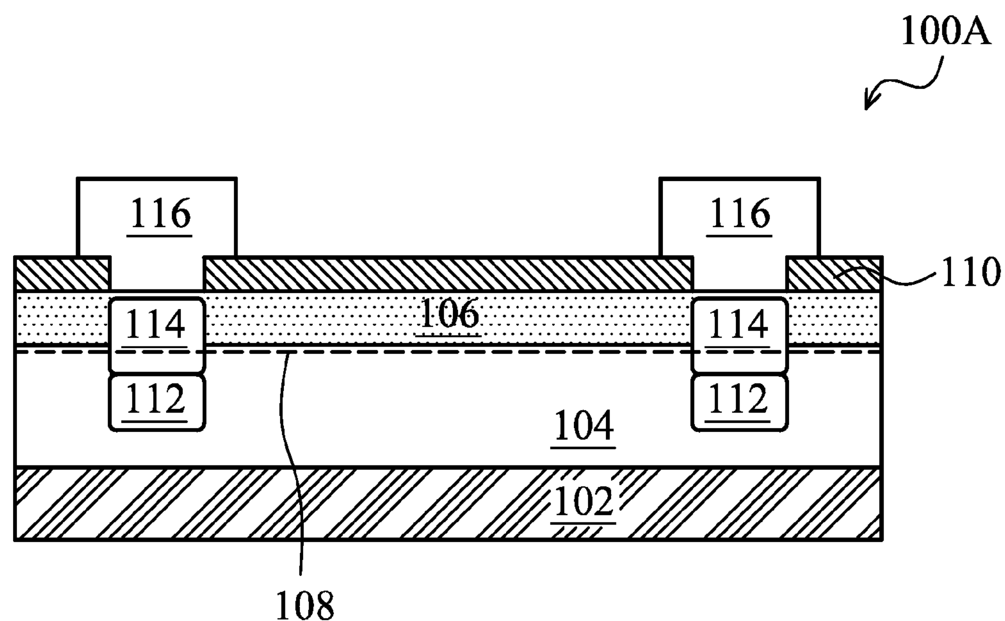

Referring back to FIG. 3, method 300 continues with operation 306. FIG. 4F illustrates a cross-sectional view of the semiconductor structure 100A for the manufacture stage after forming source/drain features 116 on the AlGaN layer 106.

In FIG. 4F, a metal layer is deposited over the dielectric cap layer 110, through the through holes 121, and contacts the top surface 107 of the AlGaN layer 106. A photoresist layer (not shown) is formed over the metal layer and developed to form a feature over the through holes 121. The metal layer not covered by the feature of the photoresist layer is removed by a reactive ion etch (RIE) process. Metal features are generated after the etching process. The photoresist layer is removed after the formation of the metal features.

Then, a thermal annealing process may be applied to the metal features such that the metal features, the AlGaN layer 106 and the GaN layer 104 react to form corresponding source/drain features 116. The source/drain feature 116 has an intermetallic compound for effective electrical connection to the carrier channel 108. In one example, the source/drain feature 116 comprises a metal including Ti, Co, Ni, W, Pt, Ta, Pd, Mo, Al or TiN. The source/drain feature 116 is free of Au in the illustrated embodiments. Without using Au in the source/drain feature 116, the method 300 is also implemented in the production line of integrated circuits on silicon substrate, because the contamination concern from the use of Au on the silicon fabrication process is eliminated.

In some embodiments, the source/drain feature 116 is at least partially embedded in the AlGaN layer 106 and overlies a portion of the dielectric cap layer 110. In certain embodiments, the source/drain feature 116 further extends into a top portion of the GaN layer 104.

Figure 4G:
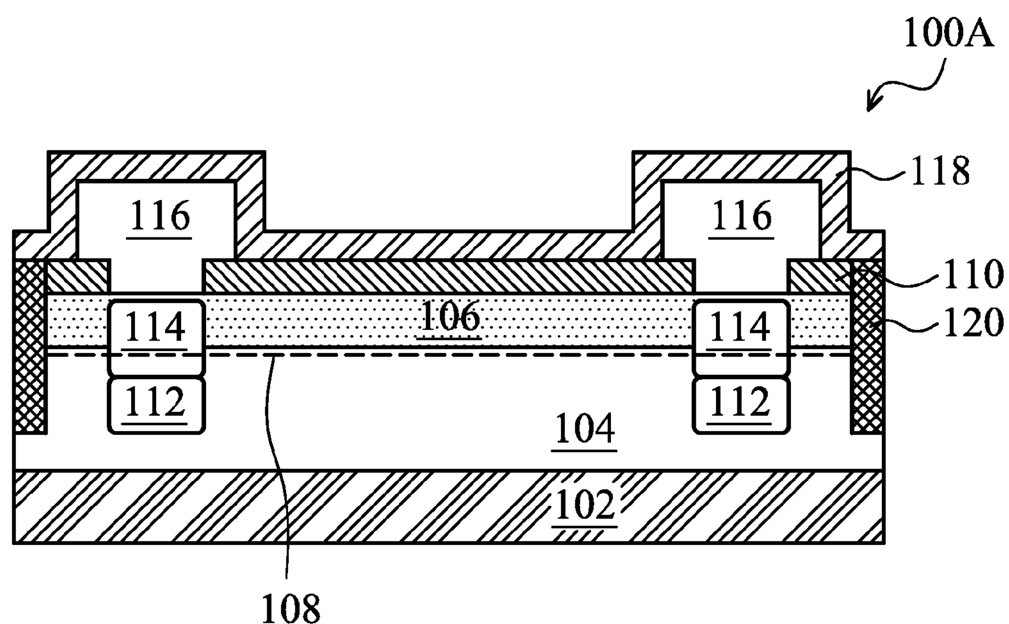

FIG. 4G is a cross-sectional view of the semiconductor structure 100A after depositing a protection layer 118 on each source/drain feature 116 and the dielectric cap layer 110. In some embodiments, the protection layer 118 includes dielectric materials such as silicon oxide or silicon nitride. In at least one example, protection layer 118 is silicon nitride and is formed by a plasma enhanced chemical vapor deposition (PECVD) method. The protection layer 118 has a thickness in a range from about 100 nanometers to about 700 nanometers.

After the formation of the protection layer 118, isolation regions 120 are formed in the GaN layer 104 and the AlGaN layer 106. The isolation regions 120 isolate the HEMT in the semiconductor structure 100A from other devices in the substrate 102. In at least one example, the isolation region 120 is formed by an implantation process with species of oxygen or nitrogen through the protection layer 118 and the dielectric layer 110. The protection layer 118 covers the source/drain features 116, and prevents the source/drain features 116 from exposure during an annealing process after the implantation process for the isolation region 120 formation.

Referring back to FIG. 3, method 300 continues with operation 307 in which a gate electrode is formed over the second III-V compound layer between the source feature and the drain feature. The operation 307 is illustrated in FIGS. 4H and 4I.

Figure 4H:
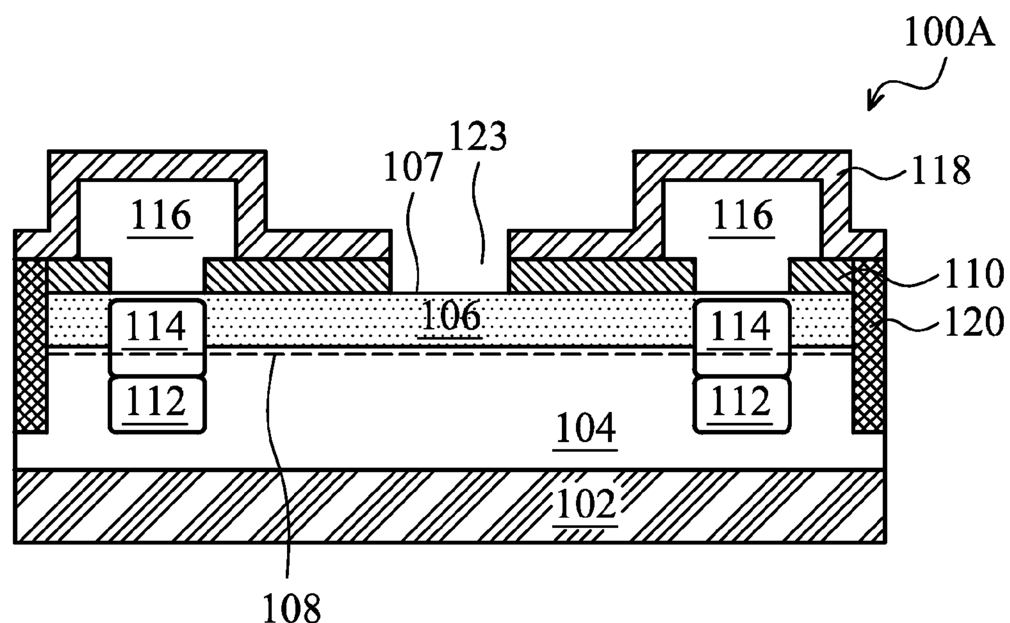

FIG. 4H illustrates the semiconductor structure 100A after forming a combined opening 123 in the protection layer 118 and the dielectric layer 110. A patterned mask layer (not shown) is formed on a top surface of the protection layer 118 and an etching process is performed to remove a portion of the protection layer 118 and the dielectric layer 110. The combined opening 123 exposes a portion of the top surface 107 of the AlGaN layer 106. The exposed portion of the AlGaN layer 106 has a substantially flat top surface between the source/drain features 116. The combined opening 123 is configured as a location for the later gate electrode formation.

Figure 4I:
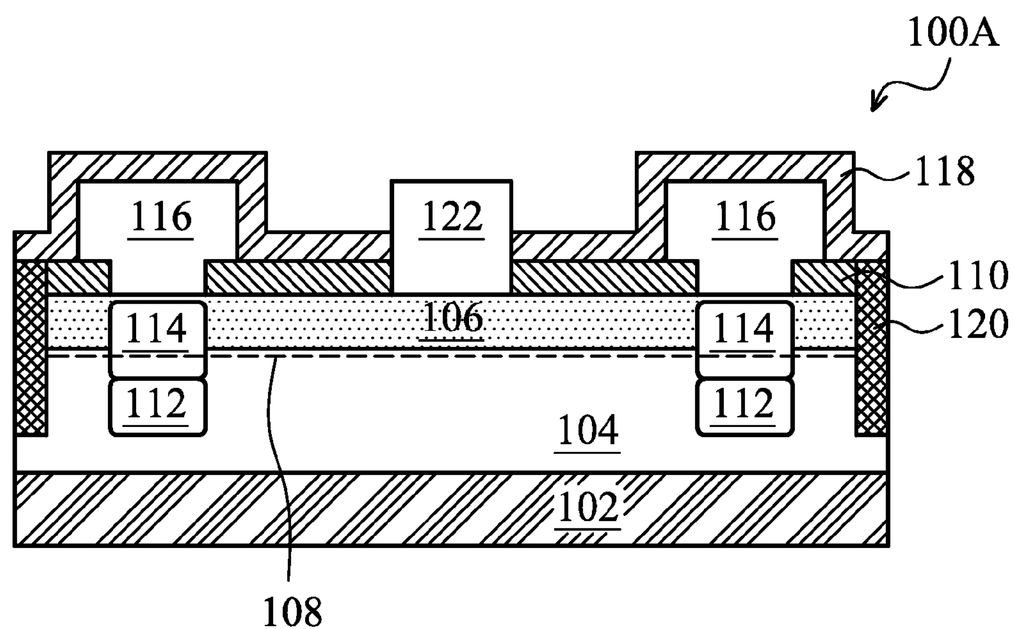

In FIG. 4I, a gate electrode layer is deposited over the protection layer 118 and overfills the combined opening 123. Lithography and etching processes are performed on the gate electrode layer to define a gate electrode 122 between the source/drain features 116. In various examples, the gate electrode layer includes a refractory metal or its compounds, e.g., titanium (Ti), titanium nitride (TiN), titanium tungsten (TiW), titanium tungsten nitride (TiWN), tungsten (W) or tungsten nitride (WN). By using the refractory metals or compounds, the method 300 can be implemented in the production line of integrated circuits on silicon substrate. The contamination concern due to unsuitable materials on the silicon-fabrication process is eliminated. In at least another example, the gate electrode layer includes nickel (Ni), gold (Au) or copper (Cu).

Figure 4J:
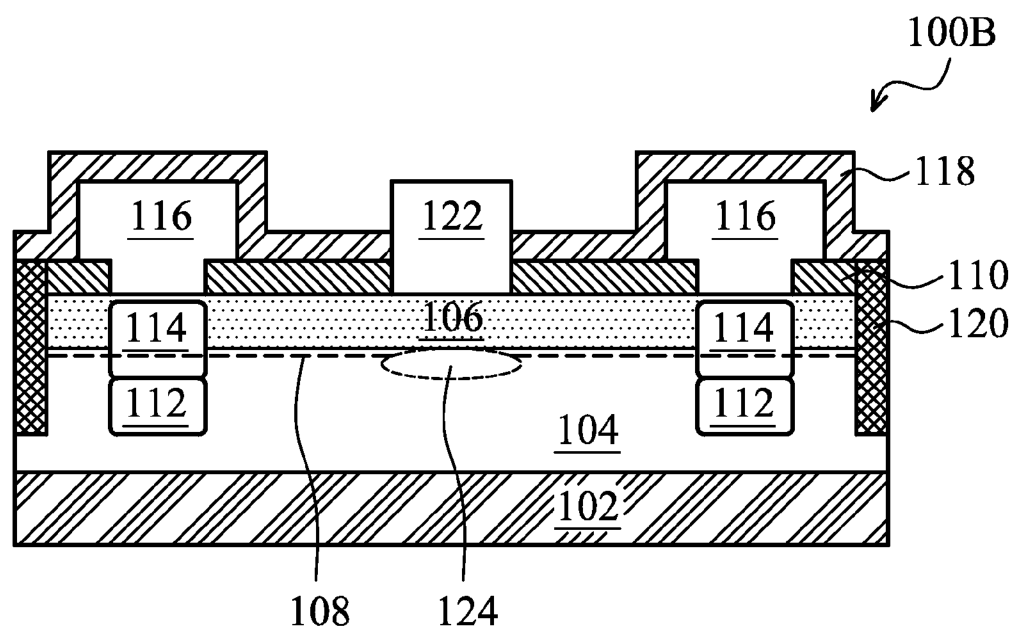

FIG. 4J is a cross-sectional view of the semiconductor structure 100B having another HEMT according to various embodiments of the method 300 of FIG. 3. The layer stacks and manufacture methods of the semiconductor structure 100B are similar to the semiconductor structure 100A. However, the HEMT in the semiconductor structure 100B is an enhanced-mode HEMT (also referred to as enhanced-mode HEMT 100B). The enhanced-mode HEMT 100B includes a depletion region 124 in the carrier channel 108.

In another embodiment, a fluorine-containing region is formed (not shown) in a portion of the AlGaN layer 106 to deplete the electrons in depletion region 124 of the carrier channel 108. In some examples, an implantation process including dopants F or $BF_2$ is performed to form the fluorine-containing region through the combined opening 123. An energy power of the implantation process is from about 5 Kev to about 20 Kev. A dosage of the dopants is in a range of about 1E12 ion/cm$^2$ to about 1E15 ion/cm$^2$. The gate electrode 122 is formed after the fluorine-containing region. The carrier channel 108 becomes normally-off because of the depletion region 122.

One aspect of this disclosure describes a high electron mobility transistor (HEMT). The HEMT includes a first III-V compound layer. A second III-V compound layer is disposed on the first III-V compound layer and is different from the first III-V compound layer in composition. A source feature and a drain feature are in contact with the second III-V compound layer. A n-type doped region underlies each source feature and drain feature in the second III-V compound layer. A p-type doped region underlies each n-type doped region in the first III-V compound layer. A gate electrode is disposed over a portion of the second III-V compound layer between the source feature and the drain feature.

Another aspect of this disclosure describes a high electron mobility transistor (HEMT). The HEMT includes a gallium nitride (GaN) layer disposed on a substrate. An aluminum gallium nitride (AlGaN) layer disposed on the GaN layer. A carrier channel is located in the GaN layer along an interface between the GaN layer and the AlGaN layer. A source feature and a drain feature are spaced apart and disposed on the AlGaN layer. A n-type doped region underlies each source feature and drain feature in the AlGaN layer. The n-type doped region contacts the carrier channel. A p-type doped region underlies each n-type doped region in the GaN layer. A gate electrode is over a portion of the AlGaN layer between the source feature and the drain feature.

The present disclosure also describes an aspect of a method of forming a high electron mobility transistor (HEMT). The method includes epitaxially growing a second III-V compound layer on a first III-V compound layer. P-type dopants are selectively implanted into the first III-V compound layer through the second III-V compound layer. N-type dopants are selectively implanted into the second III-V compound layer and the first III-V compound layer. Implanted p-type dopants and n-type dopants in the second III-V compound layer and the first III-V compound layer are annealed. A source feature and a drain feature are formed on the second III-V compound layer. A gate electrode is formed over the second III-V compound layer over the source feature and the drain feature.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a high electron mobility transistor (HEMT), the method comprising:

forming a second III-V compound layer on a first III-V compound layer, the second III-V compound layer and the first III-V compound layer differing in composition;

forming a p-type doped region in the first III-V compound layer;

forming an n-type doped region in the second III-V compound layer, the n-type doped region overlying the p-type doped region;

forming a source feature over the second III-V compound layer, the source feature overlying the n-type doped region; and forming a gate electrode over the second III-V compound layer, the gate electrode disposed laterally adjacent to the source feature.

2. The method of claim 1, wherein the forming the second III-V compound layer on the first III-V compound layer comprises epitaxially growing the second III-V compound layer on the first III-V compound layer.

3. The method of claim 1, wherein the forming the p-type doped region comprises selectively implanting p-type dopants into the first III-V compound layer through the second first III-V compound layer.

4. The method of claim 3, wherein the p-type dopants comprise a Group II element.

5. The method of claim 3, wherein the p-type dopants comprise magnesium, calcium, beryllium or zinc.

6. The method of claim 1, wherein the forming the n-type doped region comprises selectively implanting n-type dopants into the first III-V compound layer and the second III-V compound layer.

7. The method of claim 6, wherein the n-type dopants comprise a Group IV element.

8. The method of claim 6, wherein the n-type dopants comprise silicon or oxygen.

9. The method of claim 1, wherein the n-type doped region comprises a peak concentration having a distance $D_2$ away from an interface between the first III-V compound layer and the second III-V compound layer, the distance $D_2$ being less than about 50 nm.

10. The method of claim 1, wherein the p-type doped region comprises a peak concentration having a distance $D_1$ away from an interface between the first III-V compound layer and the second III-V compound layer, the distance $D_1$ is in a range from about 50 nm to about 350 nm.

11. A method of forming a high electron mobility transistor (HEMT), the method comprising:

selectively implanting p-type dopants into a first III-V compound layer through a second III-V compound layer disposed over the first III-V compound layer;

selectively implanting n-type dopants into the second III-V compound layer and the first III-V compound layer;

annealing implanted p-type dopants and n-type dopants in the second III-V compound layer and the first III-V compound layer;

forming a source feature and a drain feature on the second III-V compound layer; and forming a gate electrode over the second III-V compound layer between the source feature and the drain feature.

12. The method of claim 11, wherein the annealing comprises annealing in an environment comprising nitrogen.

13. The method of claim 11, wherein the selectively implanting p-type dopants comprises:

forming a photoresist layer over the second III-V compound layer;

forming an opening in the photoresist layer, the opening exposing a portion of the second III-V compound layer; and implanting the p-type dopants through the opening and the exposed portion of the second III-V compound layer into the first III-V compound layer.

14. The method of claim 11, wherein the selectively implanting n-type dopants comprises implanting the n-type dopants in a region of the second III-V compound layer and the first III-V compound layer overlying the implanted p-type dopants.

15. The method of claim 11, wherein the source feature and the drain feature are free of Au and comprise Ti, Co, Ni, W, Pt, Ta, Pd, Mo, Al or TiN.

16. The method of claim 11, wherein the first III-V compound layer and the second III-V compound layer differ in composition, and wherein a carrier channel is located in the first III-V compound layer along an interface between the first III-V compound layer and the second III-V compound layer.

17. A method of forming a high electron mobility transistor (HEMT), the method comprising:

forming a gallium nitride (GaN) layer on a substrate;

forming an aluminum gallium nitride (AlGaN) layer on the GaN layer;

forming a source feature and a drain feature spaced apart from each other and on the AlGaN layer;

forming an n-type doped region underlying each source feature and drain feature in the AlGaN layer;

forming a p-type doped region underlying each n-type doped region in the GaN layer; and forming a gate electrode over a portion of the AlGaN layer between the source feature and the drain feature.

18. The method of claim 17, wherein the forming the AlGaN layer comprises epitaxially growing the AlGaN layer on the GaN layer.

19. The method of claim 17, wherein the forming the n-type doped region comprises selectively implanting n-type dopants into the AlGaN layer and the GaN layer.

20. The method of claim 17, wherein the forming the p-type doped region comprises selectively implanting p-type dopants into the GaN layer.

* * * * *